United States Patent [19]

Shams et al.

[11] Patent Number: 5,096,881
[45] Date of Patent: Mar. 17, 1992

[54] PREPARATION OF A SUPERCONDUCTING $TL_2CA_2BA_2CU_3O_x$ THICK FILM BY PROCESSING A ROLLED CA-BA-CU-O FILM IN $TL_2O_3$ VAPOR

[75] Inventors: Qamar A. Shams, Cincinnati, Ohio; Allen M. Hermann, Golden, Colo.; Zhengzhi Sheng, Fayetteville, Ark.

[73] Assignee: The University of Arkansas, Little Rock, Ark.

[21] Appl. No.: 493,640

[22] Filed: Mar. 15, 1990

[51] Int. Cl.$^5$ .............................. B05D 5/12
[52] U.S. Cl. ........................ 505/1; 505/732; 505/742; 427/62; 427/126.3; 427/194; 427/190; 427/341; 427/248.1
[58] Field of Search ............ 505/1, 732, 730, 742; 427/62, 63, 126.3, 248.1, 255, 333, 341, 194, 190

[56] References Cited

U.S. PATENT DOCUMENTS

| | | | |
|---|---|---|---|
| 4,714,654 | 12/1987 | Ito et al. | 428/328 |
| 4,755,493 | 7/1988 | Takeuchi et al. | 501/134 |
| 4,870,052 | 9/1989 | Engler et al. | 505/1 |
| 4,880,773 | 11/1989 | Itozaki et al. | 505/1 |

FOREIGN PATENT DOCUMENTS

| | | |
|---|---|---|
| 0280812 | 9/1988 | European Pat. Off. |
| 0284062 | 9/1988 | European Pat. Off. |
| 0286289 | 10/1988 | European Pat. Off. |
| 0292340 | 11/1988 | European Pat. Off. |
| 0301952 | 2/1989 | European Pat. Off. |
| 0301958 | 2/1989 | European Pat. Off. |
| 0316009 | 5/1989 | European Pat. Off. |

OTHER PUBLICATIONS

Okada et al., "Ag-Sheathed Tl—Ba—Ca—Cu—O Superconductor tape with Tc≈120 K", Jpn. J. Appl. Phys. vol. 27(12) Dec. 1988 L2345-2347.

Sugise et al., "Preparation of $Tl_2Ba_2Ca_2Cu_3O_y$ Thick Films $B_a$—$C_a$—Cu—O Films", Jpn. J. Appl. Phys. 27(12) Dec. 1988, L2314-2316.

Hatta et al., "$P_r$-Coated Substrate Effect on Oxide Superconductive Films in Low-Temperature Processing", Appl. Phys. Lett. 53(2) July 1988 p. 148-150.

Lee et al., "Superconducting Tl—Ca—Ba—Cu—O Thin Films With Zero Resistance at Temperatures of up to 120 K", Appl. Phys. Lett. 53(4) July 1988, p. 329-331.

Lin et al., "Forming Superconducting Tl—Ca—Ba—Cu—O Thin Films by the Diffusion Method", Jpn. J. Appl. Phys. 28(1) Jan. 1989 L85-L87.

Johs et al., "Preparation of High $T_c$Tl—Ba—Ca—Cu—O Thin Films by Pulsed Laser Evaporation and $Tl_2O_3$ Vapor Processing", Appl. Phys. Lett. 54(18) May 1989 pp. 1810-1811.

Gopalakrishnan et al., "Synthesis and Properties of a 125 K Superconductor in the Tl—Ca—Ba—Cu—O System", Appl. Phys. Lett. 53(5) Aug. 1988 pp. 414-416.

Qiu et al., "Formation of Tl—Ca—Ba—Cu—O Films by Diffusin of Tl Into rf-Sputtered Ca—Ba—Cu—O", Appl. Phys. Lett. 53(12) Sept. 1988 pp. 1122-1124.

Hasegawa, T. et al., *High T. Superconductivity of $(La_{1-x}Sr_xCuO_4$—Effect of Substition . . . Superconductivity*, Japan Journal of Applied Physics, vol. 26, No. 4, Apr. 20, 1987, L337-L338.

Kishio, K. et al., *Effect of Lanthanide Ion Substitutions for Lanthanum Sites on Superconductivity of $(La_{1-x}Sr_x)_2CuO_{4-\delta}$*, Japanese Journal of Applied Physics, vol. 26, No. 4, Apr. 20, 1987, L391-L393.

(List continued on next page.)

Primary Examiner—Shrive Beck
Assistant Examiner—Roy V. King
Attorney, Agent, or Firm—Hermann Ivester

[57] ABSTRACT

The present invention provides a method for making Tl-Ca-Ba-Cu-O superconductive materials in a film shape. Pursuant to the method, after placing a $Ca_2Ba_2Cu_3O_7$ powder onto some suitable substrate, such as platinum or copper, the substrate and powder are rolled between two rollers until a desired thickness is achieved. The film can then be taken off the substrate. Thallium oxide is then evaporated on the precursor film to make superconductive films. The $Tl_2O_3$ can be evaporated in a furnace or vacuum.

21 Claims, 2 Drawing Sheets

OTHER PUBLICATIONS

Ohshima, S. et al., *Superconducting and Structural Properties of the New $Ba_{1-x}Ln_xCuO_{3-y}$ Compound System (Ln=La, Ce, Pr, Nd, Sm, Eu, . . . and Yb)*, Japanese Journal of Applied Physics, vol. 26 No. 5, May 1987, L815–L817.

Tsurumi, S. et al., *High T. Superconductivities of $A_2Ba_4Cu_6O_{14+y}$* Japanese Journal of Applied Physics, vol. 26, No. 5, May 1987, L856–L857.

*Superconductivity News*, vol. 1, No. 2, Aug. 1987, pp. 1, 2, and 6–8.

Yang, K. N. et al., *High Temperature Superconductivity in Rare-Earth (R)—Barium Copper Oxides $(RBa_2)Cu_3O_{9-\delta}$*, Solid State Communications, vol. 63, No. 6, 1987, pp. 515–519.

Tarascon, J. M. et al., *Oxygen and Rare-Earth Doping of the 90-K Superconducting Perovskite $YBa_2Cu_3O_{7-x}$*, Physical Review B, vol. 36, No. 1, 1987, 226–234.

Hor, P. H. et al., *Superconductivity Above 90 K in the Square-Planar Compound System $ABa_2Cu_3O_{6+x}$ with A=Y, La, Nd, Sm, Eu, Gd, Ho, Er, and Lu*, Physical Review Letters, vol. 58, No. 18, 1987, 1891–1894.

Khurana, A., *Superconductivity Seen Above the Boiling Point of Nitrogen*, Physics Today, Apr., 1987, 17–23.

Cava, R. J. et al., *Bulk Superconductivity at 91 K in Single-Phase Oxygen-Deficient Perovskite $Ba_2YCu_3O_{9-\delta}$*, Physical Review Letters, vol. 58, No. 16, 1987, 1676–1679.

Nagashima, T. et al., *Superconductivity in $Tl_{1.5}SrCaCu_2O_x$*, Japanese Journal of Applied Physics, vol. 27, No. 6, Jun., 1988, L1077–L1079.

Saito, Y. et al. *High-$T_c$ Superconducting Properties in $(Y_{1-x}Tl_x)Ba_2Cu_3O_{7-y}$, $Y(Ba_{1-x}R_x)_2Cu_3O_{7-y}$ and $YBa_2(Cu_{1-x}Mg_x)_3O_{7-y}$*, Physica 148B, 1987, 336–338.

Kondoh, S. et al., *Superconductivity in Tl—Ba—Cu—O System*, Solid State Communications, vol. 65, No. 11, 1988, 1329–1331.

Sera, M. et al., *On the Structure of High-$T_c$ Oxide System Tl—Ba—Cu—O*, Institute for Molecular Science, Myodaiji, Okazaki 444 Japan, 1988.

Ihara, H. et al., *Possibility of Superconductivity at 65° C. in Sr—Ba—Y—Cu—O System*, Japanese Journal of Applied Physics, vol. 26, No. 8, Aug., 1987, L1413–L1415.

Ishida, T., *Compositional Variation of High $T_c$ in $Yb_x Er_{1-x}Ba_2Cu_3O_{6+y}$ System*, Japanese Jounal of Applied Physics, vol. 26, No. 8, Aug., 1987, L1294–L1295.

Kijima, T. et al., *Superconductivity in the Bi—Sr—La—Cu—O System*, Japanese Journal of Applied Physics, vol. 27, No. 6, Jun. 1988, L1035–L1037.

Richert, B. et al., *Atomic Substitution in $YBa_2Cu_3O_7$: Modification of the Electronic Structure*, American Institute of Physics Conference Proceedings No. 165 (Thin film Processing and Characterization of High-Temperature Superconductors), Nov. 6, 1987, 277–283.

Ferreira, J. M. et al., *Long-range Magnetic Ordering the High-$T_c$ Superconductors $RBa_2Cu_3O_{7-\delta}$ (R=Nd, Sm, Gd, Dy and Er)*, Physical Review B, vol. 37, No. 4, Feb. 1, 1988, 2368–2371.

Shih, I. et al., *Multilayer Deposition of Thallium Barium Calcium Copper Oxide Films*, Applied Physics Letter 53(6), 1988, 523–525.

Ginley, D. S. et al., *Sequential Electron Beam Evaporated Films of $Tl_2CaBa_2Cu_2O_y$ with zero resistance at 97K*, Applied Physics Letters, Aug. 1, 1988, 406–408.

Parkin, S. S. P. et al., *Bulk Superconductivity at 125 K in $Tl_2Ca_2Ba_2Cu_3O_x$*, Physical Review, 1988, 2539–2542.

Sheng, Z. Z. et al., *Superconductivity in the Rare-Earth-Free Tl—Ba—Cu—O System Above Liquid-Nitrogen Temperature*, Nature, vol. 332, Mar. 3, 1988, 55–58.

Sheng, Z. Z. et al., *Superconductivity at 90 K in the Tl—Ba—Cu—O System*, Physical Review Letters, vol. 60, No. 10, Mar. 7, 1988, 937–940.

Sheng, Z. Z. et al., *Bulk Superconductivity at 120 K in the Tl—Ca/Ba—Cu—O System*, Nature, vol. 332, Mar. 10, 1988, 138–139.

Ihara H. et al., *A New High-$T_c$ $TlBa_2Ca_3Cu_4O_{11}$ Superconductor with $T_c > 120$ K*, Nature, vol. 334 Aug. 11, 1988, 510–511.

Sheng, Z. Z. et al., *$Tl_2O_3$ Vapor Process of Making Tl—Ba—Ca—Cu—O Superconductors*, Appl. Phys. Lett. 53 (26), Dec. 26, 1988, 2686–2688.

Hazen, R. M. et al., *100-K Superconducting Phases in the Tl—Ca—Ba—Cu—O System*, Physical Review Letters, vol. 60, No. 16, Apr. 18, 1988, 1657–1660.

Sheng, Z. Z. et al., *New 120 K Tl—Ca—Ba—Cu—O Superconductor*, Appl. Phys. Lett., vol. 52, No. 20, May 16, 1988, 1738–1740.

(List continued on next page.)

OTHER PUBLICATIONS

Oota, A. et al., *Electrical, Magnetic and Superconducting Properties of High-$T_c$ Superconductor (Y, Sc)—(Ba, Sr)—Cu Oxide*, Japanese Journal of Appl. Physics, vol. 26, No. 8, Aug. 1987, L1356-L1358.

Iwazumi, T. et al., *Identification of a Structure with Two Superconducting Phases in L—Ba—Cu—O System (L=La or Y)*, Japanese Journal of Applied Physics, vol. 26, No. 5, May, 1987, L621-L623.

Capone, II; D. W. et al., *Super Critical Fields and High Superconducting Transition Temperatures of $La_{1.85}Sr_{0.15}CuO_4$ and $La_{1.85}Ba_{0.15}CuO_4$*, Appl. Phys. Lett 50 (9), Mar. 2, 1987, 543-544.

Johnson, D. W. et al., *Fabrication of Ceramic Articles from High $T_c$ Superconducting Oxides*, Materials Research Society, Symposium S Proceedings (High Temperature Superconductors), Apr. 1987, 193-195.

Garwin, L. *Superconducting Conference Yields New Temperature Record*, Nature vol. 332 Mar. 10, 1988.

Suzuki, A. et al., *Rare-Earth (RE)—Barium Solubility Behavior in $Y(Ba_{2-x}RE_x)Cu_3O_{7+\delta}$ and $Sm(Ba_{2-x}RE_x)Cu_3O_{7+\delta}$*, Japanese Journal of Applied Physics, vol 27, No. 5, May, 1988, L792-L794.

Nagashima, T. et al., *Improving Superconducting Characteristics of Tl—Sr—Ca—Cu—O by Doping with Pb and/or Rare-Earth Elements*, Japanese Journal of Applied Physics, vol. 28, No. 6, Jun. 1989, L930-L933.

Vijayaraghavan, R. et al., *Investigations of Novel Cuprates of the $TlCa_{1-x}Ln_xSr_2Cu_2O_{7-\delta}$(Ln=rare earth) Series Showing Electron-or Hole-Superconductivity Depending on the Composition*, Superconducting Science and Technology, vol. 2(3), Sept. 1989, 195-201.

Inoue, O. et al., *Superconductivity in a Tl—Sr—Y—Cu—O System*, Japanese Journal of Applied Physics, vol. 28, No. 8, Aug. 1989, L1375-L1377.

Peters, P. N. et al., *Observation of Enhanced Properties in Samples of Silver Oxide Doped $YBa_2Cu_3O_x$*, Appl. Phys. Lett 52 (24), Jun. 13, 1988, 2066-2067.

S. Natarajan et al., *Superconductivity Studies on $(Y_{1-x}Ln_x)Ba_2Cu_3O_7$, Ln=La, Pr, Tb*, Physica C, vol. 153-155, Feb. 1988, 926-927.

D. D. Sarma et al., *Electronic Structure of High-$T_c$ Superconductors from Soft-x-ray Absorption*, Physical Review B, vol. 37, No. 16, Jun. 1988, 9784-9787.

K. Kishio et al., *Supeconductivity Achieved at Over Liquid Nitrogen Temperature by (Mixed Rare Earths)-Ba—Cu Oxides*, Japanese Journal of Applied Physics, vol. 26 No. 5, May 1987, L694-L696.

Waldrop, M. Mitchell, *Thallium Superconductor Reachs 125K*, Research News, Mar. 1988, 1243.

Qadri, S. B. et al., *X-ray Identification of the Superconducting High-$T_c$ Phase in the Y—Ba—Cu—O System*, Physical Review B, vol. 35, No. 13, 1987.

Murphy, D. W. et al., *New Superconducting Cuprate Perovskites*, Physical Review Letters, vol. 58, May 1987, 1888-1890.

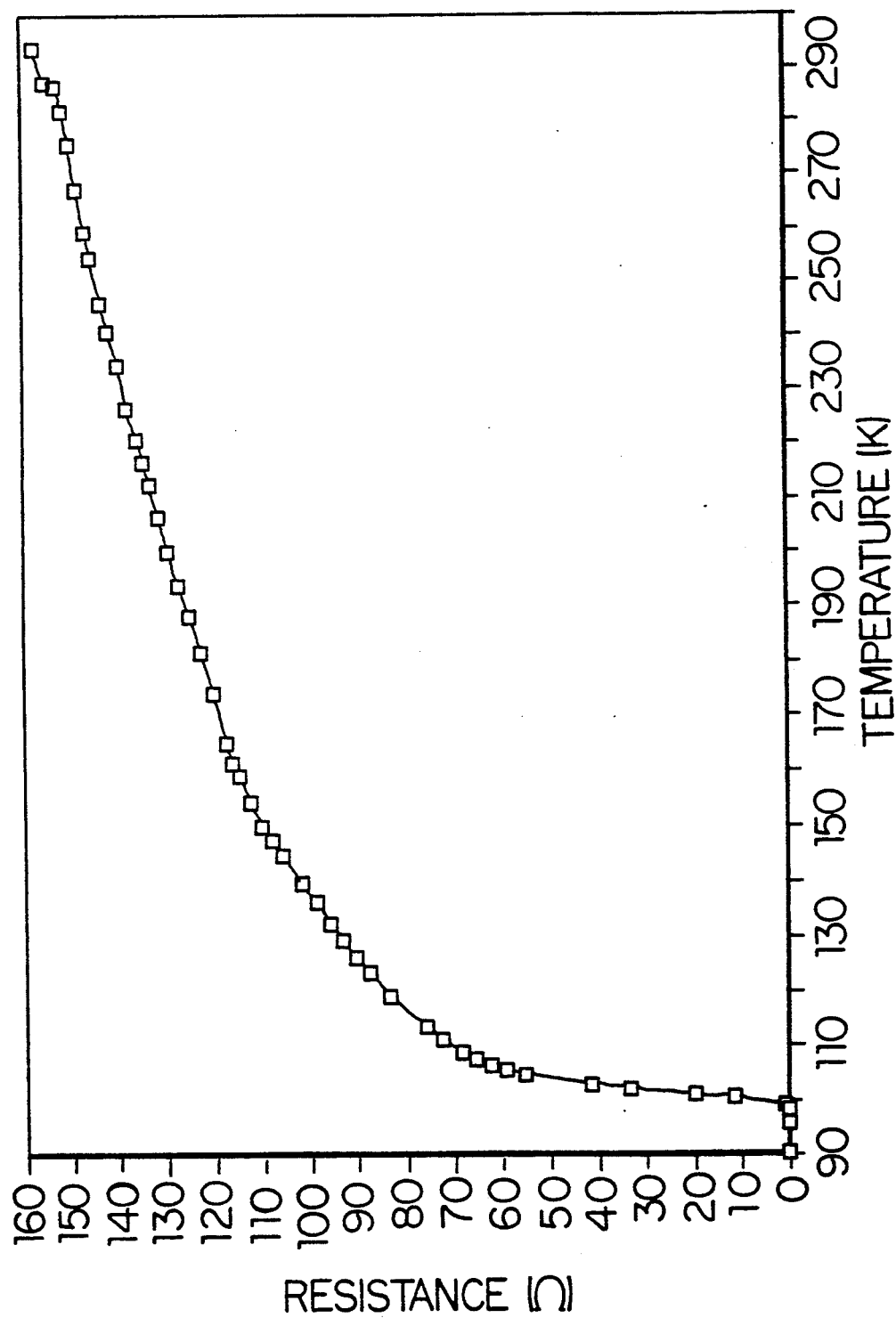

PREPARATION OF A SUPERCONDUCTING TL$_2$CA$_2$BA$_2$CU$_3$O$_x$ THICK FILM BY PROCESSING A ROLLED CA-BA-CU-O FILM IN TL$_2$O$_3$ VAPOR

BACKGROUND OF THE INVENTION

The present invention relates generally to high temperature superconductors. More specifically, the present invention provides methods for the fabrication of high temperature superconducting thick films, tapes, and wires, as well as superconducting films, tapes, and wires.

A variety of superconducting systems are known. Although superconducting materials have a great many potential applications, due to their physical nature and structure, it is difficult to fabricate superconductive materials into useful shapes. Such useful shapes include films, tapes, and wires. The ability to fabricate superconducting materials into useful shapes would provide many advantages such as, for example, providing low cost processing and manufacturing and a guide to the manufacture of new and higher temperature superconducting films. Furthermore, with respect to the Tl-Ca-Ba-Cu-O superconducting system, the ability to fabricate such shapes could minimize potential problems caused by the toxicity and volatility of Tl$_2$O$_3$ superconducting materials.

U.S. patent application Ser. No. 155,247, filed on Feb. 12, 1988, in the names of Hermann and Sheng, discloses Tl-Ca-Ba-Cu-O superconducting materials and processes for making same. U.S. patent application Ser. No. 236,507, now U.S. Pat. No. 4,962,083 filed on Aug. 25, 1988, in the names of the inventors of the present patent application discloses processes for making Tl-Ca-Ba-Cu-O superconducting films. The patent application discloses a Tl-evaporation process through which Ca-Ba-Cu-O precursors are formed into Tl-Ca-Ba-Cu-O films, tapes, and wires.

SUMMARY OF THE INVENTION

The present invention provides a process for manufacturing Tl-Ca-Ba-Cu-O superconducting films. The process includes the step of evaporating thallium oxide in a furnace or vacuum evaporator onto rolled Ca-Ba-Cu-O films. The process results in the creation of a superconducting Tl-Ca-Ba-Cu-O film. In an embodiment, the process results in the creation of superconducting Tl-Ca-Ba-Cu-O thick films.

Pursuant to an embodiment of the method of the present invention, the Tl-Ca-Ba-Cu-O superconducting films are produced in a process comprising the steps of:

1) rolling a Ca-Ba-Cu-O film on platinum or some other substrate; and
2) evaporating thallium oxide onto the Ca-Ba-Cu-O film.

In an embodiment, the method includes the step of annealing the resultant thallium oxide evaporated film.

In an embodiment of the method of the present invention, the Ca-Ba-Cu-O film is created by rolling Ca$_2$Ba$_2$Cu$_3$O$_x$ powder down between two rollers, on a substrate, at room temperature. In an embodiment, the film is then taken off the substrate.

Pursuant to the method of the present invention, in an embodiment, thallium oxide can be evaporated on the films (with or without the substrate) by thermal evaporation in a vacuum. Also, in an embodiment, the Tl$_2$O$_3$ can be evaporated onto the films through a vapor process. See, U.S. patent application Ser. No. 236,507, filed on Aug. 25, 1988, the disclosure of which is incorporated herein by reference.

The method of the present invention creates a Tl-Ca-Ba-Cu-O superconductive film or tape. The film or tape can then be fabricated into wires. The superconductive system of the present invention has the following approximate stoichiometry $$TlCa_xBa_yCu_uO_v$$

wherein:
x is greater than or equal to 0.5 and less than or equal to 6;
y is greater than or equal to 0.25 and less than or equal to 2;
$x+y+u \leq v \leq x+y+u+2$.

Accordingly, an advantage of the present invention is to provide a relatively easy method for forming superconducting films or tape.

Moreover, an advantage of the present invention is that it provides a method for creating superconducting thick films or tape for use in wire making.

A further advantage of the present invention is that it provides Tl-Ca-Ba-Cu-O films that exhibit extremely low resistivity in the normal state.

Another advantage of the present invention is that it provides an improved method for creating materials having superconductive properties.

A still further advantage of the present invention is that it provides a more commercially viable superconductive material.

Additional features and advantages of the present invention are described in, and will be apparent from, the detailed description of the presently preferred embodiments and from the drawings.

BRIEF DESCRIPTION OF THE DRAWINGS

FIG. 2 illustrates, graphically, the relationship of electrical resistance versus temperature for a thallium evaporated thick film made pursuant to an embodiment of the method of the present invention.

DETAILED DESCRIPTION OF THE PRESENTLY PREFERRED EMBODIMENTS

Figure 1:
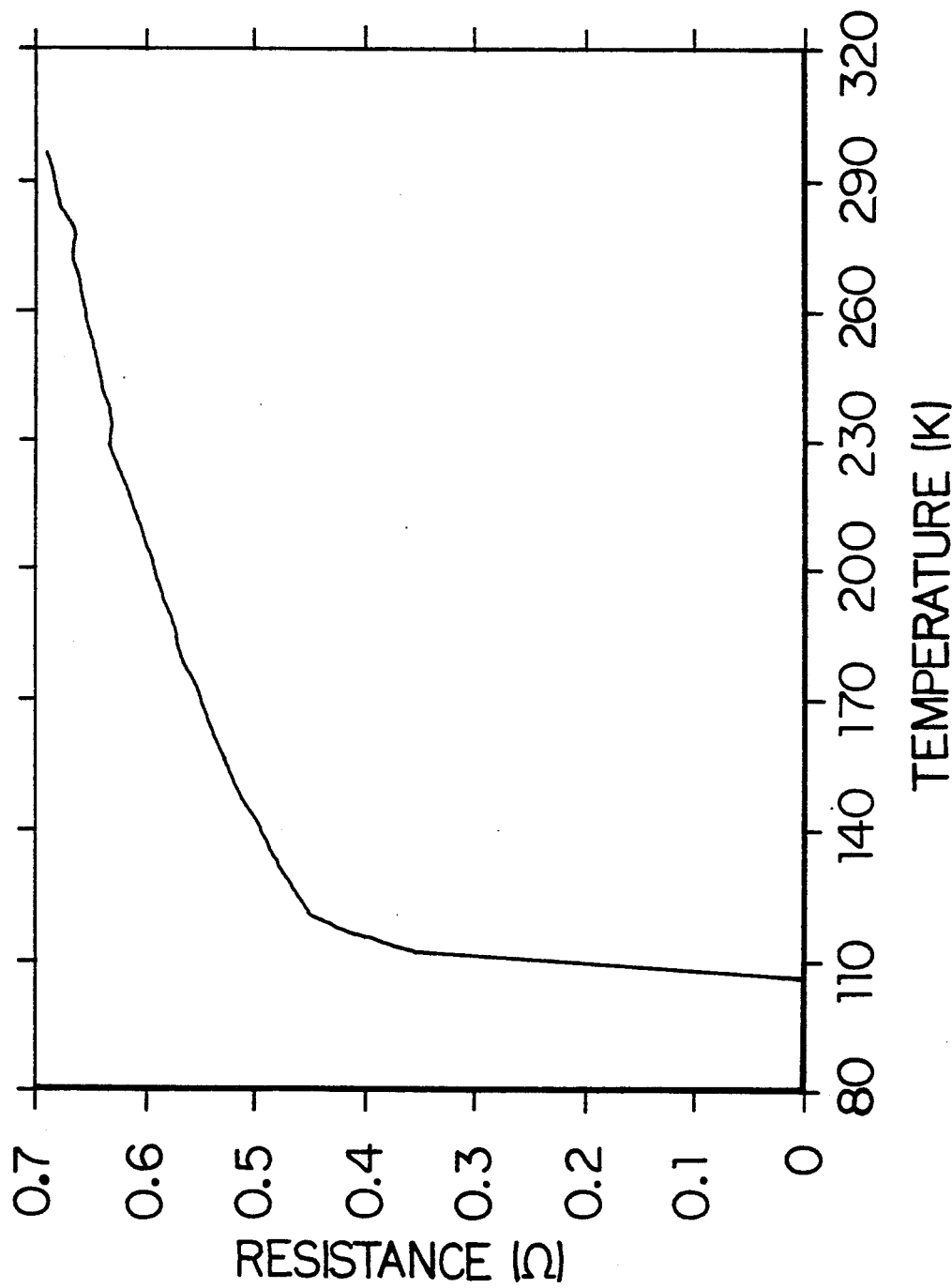
FIG. 1 illustrates, graphically, the relationship of electrical resistance versus temperature for a thallium evaporated thick film made pursuant to an embodiment of the method of the present invention.

The present invention provides a method for making Tl-Ca-Ba-Cu-O films and wires, as well as, the films and wires made therefrom.

Briefly, in an embodiment, the method for making Tl-Ca-Ba-Cu-O superconducting film according to the present invention comprises the steps of:

1) preparing Ba-Ca-Cu-O precursor films through a rolling method;
2) vapor processing the rolled Ba-Ca-Cu-O precursor films with Tl$_2$O$_3$; and
3) annealing the thallium oxide evaporated films.

In an embodiment, the vapor processing is performed in a furnace at a temperature of approximately 900° C. with flowing oxygen, at atmospheric pressure.

Briefly, in another embodiment of the method of the present invention for making Tl-Ca-Ba-Cu-O superconducting film, the method comprises the steps of:

1) preparing Ba-Ca-Cu-O precursor films through a rolling method;

2) evaporating $Tl_2O_3$ onto the rolled precursor Ba-Ca-Cu-O film in a vacuum evaporator: and 3) annealing of thallium oxide evaporated films.

In an embodiment, of each of the above described methods, the annealing step is performed in a furnace at 900° C. with flowing oxygen.

The method of the present invention provides high quality Tl-Ba-Ca-Cu-O superconducting films. Moreover, the method of the present invention provides a relatively simple, and low cost, procedure for processing and manufacturing Tl-Ca-Ba-Cu-O superconducting films and tapes that can be processed into wires.

The resultant films of the present invention demonstrate extremely low resistivity, on the order of $2 \times 10^{-4}$ ohm-cm at room temperature. Some of the films, with a platinum substrate, have an even lower resistivity, on the order of $4.8 \times 10^{-5}$ ohm-cm at room temperature.

Pursuant to the method of the present invention, a calcium-barium-copper-oxide mixture is prepared. The calcium-barium-copper-oxides are preferably produced by grinding and mixing CuO and CaO with either $BaCO_3$ or $BaO_2$.

Preferably, after the grinding and mixing step, the resultant calcium-barium-copper-oxide powder is heated. In an embodiment, the resultant calcium-barium-copper-oxide powder is heated in an atmospheric environment at approximately 900° C. for approximately 24 hours.

The calcium-barium-copper-oxide powder is then placed on a substrate such as, for example, platinum or copper and passed between rollers. The calcium-barium-copper-oxide which is now in the form of a film, is then either vapor processed with $Tl_2O_3$ in a furnace with flowing oxygen, or $Tl_2O_3$ is evaporated onto the Ca-Ba-Cu-O film in a vacuum evaporator.

Preferably, the film has a thickness of approximately 40 microns to about 70 microns. As used herein, the term "thick film" means a film having a thickness of at least 10 microns.

In an embodiment, the resultant superconductor, produced by the method of the present invention, is based on a superconductor system having the following approximate stoichiometry.

wherein:

x is greater than or equal to 0.5 and less than or equal to 6;

y is greater than or equal to 0.25 and less than or equal to 2;

u is greater than or equal to 0.5 and less than or equal to 7.5; and v is greater than or equal to z+y+u and less than or equal to z+y+u+2.

By way of example, and not limitation, examples of the method of the present invention for making high temperature superconducting films will now be given:

EXAMPLE 1

A. The following reagents were utilized:
1. $Tl_2O_3$
2. CaO
3. $BaCO_3$
4. CuO

B. The following procedure was followed using the above reagents to create a superconductive compound:

A mixture of a two molar portion of $BaCO_3$, two molar portion of CaO, and three molar portion of CuO were ground with an agate mortar and pestle. The ground mixture was heated in air at approximately 925° C. for more than 24 hours (with several intermediate grindings) to obtain a uniform black powder with a nominal composition $Ca_2Ba_2Cu_3O_7$.

After grinding the $Ca_2Ba_2Cu_3O_7$ powder was placed on a platinum substrate. It should be noted, however, that the powder could have been placed on any other suitable substrate such as copper, in powder form or in pellet form. The powder was then rolled between two rollers (AMI Center "C", Applied Mechanics, Inc., Fayetteville, AR) at room temperature until a desired thickness of approximately 40 microns to about 70 microns was achieved. The film was then taken off the substrate to produce a free-standing precursor thick film. The resultant precursor thick film was subjected to a $Tl_2O_3$ vapor process as follows:

A small platinum boat containing a small amount of $Tl_2O_3$ approximately 0.2 to about 0.3 grams was placed in a quartz boat. The Ca-Ba-Cu-O precursor thick film was then placed above the platinum boat. The quartz boat with its contents was put into a tube furnace, which had been heated to 900° C. The quartz boat and contents were heated for about 3 minutes in flowing oxygen. This was followed by a furnace-cooling.

The film, produced pursuant to this example, formed a superconductive layer. FIG. 1 illustrates, graphically, the resistance of a Tl-Ca-Ba-Cu-O film made pursuant to this example, as a function of temperature. The superconducting film reached zero resistance at 106K. The resultant film had the following approximate stoichiometry:

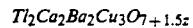

wherein z is greater than or equal to 0.5 and less than or equal to 2.

EXAMPLE 2

A. The following reagents were utilized:
1. $Tl_2O_3$
2. CaO
3. $BaCO_3$
4. CuO

B. The following procedure was followed using the above reagents to create a superconducting film:

A mixture of a two molar portion of $BaCO_3$, two molar portion of CaO, and three molar portion of CuO were ground with an agate mortar and pestle. The ground mixture was heated in air at approximately 925° C. for more than 24 hours (with several intermediate grindings) to obtain a uniform black powder with a nominal composition of $Ca_2Ba_2Cu_3O_7$.

After grinding, the $Ca_2Ba_2Cu_3O_7$ powder was placed onto a platinum substrate. Again, it should be noted that another suitable substrate such as copper could have been utilized, in powder form or in pellet form. The powder and substrate was rolled between two rollers (AMI Center "C", Applied Mechanics, Inc., Fayetteville, AR) at room temperature until a desired thickness of approximately 70 microns was achieved. The film was then removed from the substrate.

The precursor thick film was then subjected to a Tl$_2$O$_3$ thermal evaporation in a vacuum (pressure about 5×10$^{-6}$ Torr) with 60 amperes current flowing through the evaporation filament, (the thermal resistance evaporator used was a High Vacuum Equipment Corporation HV-4F vacuum system and C-0018 coater system). The procedure that was used was as follows:

The evaporation filament consisted of a tungsten boat. The thick film was supported on a net which was approximately 6 inches from the boat. There was a shutter between the filament and the film. The Tl$_2$O$_3$ was put in the tungsten boat. The bell jar of the system was lowered and evacuated to 5×10$^{-6}$ Torr. At this vacuum, the filament was turned on and the current increased slowly to 60 amperes wherein the thallium oxide started to evaporate. At this time, the shutter between the film and filament was removed using a mechanical handle located outside the bell jar. It took almost 30 seconds to complete the evaporation. The filament was then turned off. Air was then leaked into the system to bring the system to atmospheric pressure before the film was taken out of the bell jar.

The Tl$_2$O$_3$ coated film was then removed from the vacuum system and put above a platinum boat containing Tl$_2$O$_3$. The quartz boat with its contents was put into a tube furnace, which had been heated to 900° C. The boat and contents was heated for about 3 minutes in flowing oxygen followed by a furnace-cooling.

The film, produced pursuant to this example, formed a superconductive film. FIG. 2 illustrates, graphically, the resistance of a Tl-Ca-Ba-Cu-O film made pursuant to this example, as a function of temperature. The film reached zero resistance at about 100 K. The superconducting film had the following approximate stoichiometry:

$$Tl_2Ca_2Ba_2Cu_3O_{7+1.5z}$$

wherein z is greater than or equal to 0.5 and less than or equal to 2.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. A method for making a high temperature superconducting thick film comprising the step of creating a Ba-Ca-Cu-O precursor thick film by rolling a nominal composition represented by the formula:

$$Ca_xBa_yCu_uO_v$$

wherein:
x is greater than or equal to 0.5 and less than or equal to 6;
y is greater than or equal to 0.25 and less than or equal to 2;
u is greater than or equal to 0.5 and less than or equal to 7.5; and
$x+y+u \leq v \leq x+y+u+2$ onto a substrate; and
vapor evaporating Tl$_2$O$_3$ in flowing oxygen at atmospheric pressure onto the Ba-Ca-Cu-O precursor thick film and annealing the resultant thick film.

2. The method of claim 1 wherein the substrate is chosen from the group consisting of platinum and copper.

3. The method of claim 1 including the step of taking the Ca-Ba-Cu-O film off the substrate after the rolling step.

4. A method for making high temperature superconducting thick film comprising the step of creating a Ba-Ca-Cu-O precursor thick film by rolling a nominal composition represented by the formula:

$$Ca_xBa_yCu_uO_v$$

wherein:
x is greater than or equal to 0.5 and less than or equal to 6;
y is greater than or equal to 0.25 and less than or equal to 2;
u is greater than or equal to 0.5 and less than or equal to 7.5; and
$x+y+u \leq v \leq x+y+u+2$ onto a substrate; and
evaporating, in a vacuum, thallium oxide onto the Ba-Ca-Cu-O precursor thick film and annealing the resultant film.

5. The method of claim 10 wherein the substrate is chosen from the group consisting of platinum and copper.

6. The method of claim 10 including the step of removing the Ca-Ba-Cu-O film powder from the substrate after the rolling process.

7. A method for making a superconducting film comprising the steps of:
rolling a Ca-Ba-Cu-O powder between rollers to form a film;
evaporating Tl$_2$O$_3$ onto a resultant Ca-Ba-Cu-O film; and
annealing a resultant Tl$_2$O$_3$ film.

8. The method of claim 7 wherein the calcium-barium-copper-oxide has a normal composition represented by the formula:

$$Ca_xBa_yCu_uO_v$$

wherein:
$0.5 \leq x \leq 6$;
$0.25 \leq y \leq 2$; and
$0.5 \leq u \leq 7.5$.
and
$x+y+u \leq v < x+y+u+2$.

9. The method of claim 7 including the step of grinding and mixing CaO, BaCO$_3$ and CuO to create the Ca-Ba-Cu-O powder.

10. The method of claim 7 including the step of grinding and mixing CaO, BaO$_2$, and CuO to create the Ca-Ba-Cu-O powder.

11. The method of claim 7 wherein the Ca-Ba-Cu-O is rolled to make a film having a thickness of approximately 40 to about 70 microns.

12. The method of claim 7 including the step of evaporating the Tl$_2$O$_3$ in a vacuum.

13. The method of claim 7 including the step of evaporating the Tl$_2$O$_3$ in a furnace.

14. A method for making a high temperature superconducting thick film comprising the steps of:
grinding a mixture of CaO and CuO and at least one compound chosen from the group consisting of BaO and BaCO$_3$;

heating the ground mixture to obtain a CaBaCuO mixture;

forming the CaBaCuO mixture into a thick film by passing the mixture between a pair of rollers;

evaporating $Tl_2O_3$ onto the thick film; and annealing the CaBaCuO thick film coated with $Tl_2O_3$.

15. The method of claim 14 wherein:

the CaBaCuO mixture has the nominal stoichiometry $Ca_xBa_yCu_uO_v$ wherein:

$0.5 \leq x \leq 6$;

$0.25 \leq y \leq 2$;

$0.5 \leq u \leq 7.5$ and $x+y+u \leq v < x+y+u+2$.

16. The method of claim 14 wherein the CaBaCuO mixture is heated approximately 925° C. for about 24 hours.

17. The method of claim 14 wherein the CaBaCuO mixture is rolled to make the thick film.

18. The method of claim 14 wherein $Tl_2O_3$ is evaporated on the Ca-Ba-Cu-O thick film in a vacuum.

19. The method of claim 14 wherein the $Tl_2O_3$ is evaporated on the Ca-Ba-Cu-O thick film in a furnace.

20. The method of claim 14 wherein coated Ca-Ba-Cu-O thick film is annealed at 900° C. in flowing $O_2$.

21. The method of claim 14 wherein the $Tl_2O_3$ is evaporated onto the Ca-Ba-Cu-O thick film in a furnace at approximately 900° C., in following oxygen, and at atmospheric pressure.

* * * * *